(12) United States Patent
Zhao et al.

(10) Patent No.: US 12,532,619 B2
(45) Date of Patent: Jan. 20, 2026

(54) DISPLAY SUBSTRATE AND DISPLAY APPARATUS

(71) Applicant: BOE Technology Group Co., Ltd., Beijing (CN)

(72) Inventors: Jia Zhao, Beijing (CN); Pinfan Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 804 days.

(21) Appl. No.: 17/910,358

(22) PCT Filed: Nov. 2, 2021

(86) PCT No.: PCT/CN2021/128196
§ 371 (c)(1),
(2) Date: May 11, 2023

(87) PCT Pub. No.: WO2023/077269
PCT Pub. Date: May 11, 2023

(65) Prior Publication Data
US 2024/0215345 A1    Jun. 27, 2024

(51) Int. Cl.
*H01L 29/08* (2006.01)
*G09G 3/3266* (2016.01)
(Continued)

(52) U.S. Cl.
CPC ......... *H10K 59/131* (2023.02); *G09G 3/3266* (2013.01); *H10K 59/1213* (2023.02)

(58) Field of Classification Search
CPC . H10K 59/131; H10K 59/1213; G09G 3/3266
(Continued)

(56) References Cited

U.S. PATENT DOCUMENTS

| | | |
|---|---|---|
| 2020/0168824 A1 | 5/2020 | Park et al. |
| 2020/0342791 A1 | 10/2020 | Song et al. |

(Continued)

FOREIGN PATENT DOCUMENTS

| | | | | |
|---|---|---|---|---|
| CN | 110021231 A | * | 7/2019 | ............... G09F 9/00 |
| CN | 111244133 A | | 6/2020 | |

(Continued)

OTHER PUBLICATIONS

Office Action dated Jul. 10, 2025 for CN202180003214.2 and English Translation.

*Primary Examiner* — Phuc T Dang
(74) *Attorney, Agent, or Firm* — Ling Wu; Stephen Yang; Ling and Yang Intellectual Property

(57) ABSTRACT

A display substrate and a display apparatus. The display substrate includes a base substrate and a circuit structure layer disposed on the base substrate, the circuit structure layer includes a flat region and a bendable region provided on at least one side of the flat region, the bendable region includes at least one stretch region, the stretch region includes a first pixel circuit region and a first power supply trace region, the first power supply trace region is located at one side of the first pixel circuit region away from the flat region, a first stretch hole is provided in the first power supply trace region, and a second stretch hole is provided in the first pixel circuit region.

20 Claims, 5 Drawing Sheets

(51) Int. Cl.
*H10K 59/121* (2023.01)
*H10K 59/131* (2023.01)

(58) Field of Classification Search
USPC .......................................... 257/40
See application file for complete search history.

(56) References Cited

U.S. PATENT DOCUMENTS

| | | |
|---|---|---|
| 2021/0028155 A1 | 1/2021 | Kim |
| 2022/0320223 A1 | 10/2022 | Wang |
| 2022/0393122 A1 | 12/2022 | Liu et al. |

FOREIGN PATENT DOCUMENTS

| | | | | |
|---|---|---|---|---|
| CN | 111681547 A | | 9/2020 | |
| CN | 112863341 A | | 5/2021 | |
| CN | 112992995 A | | 6/2021 | |
| CN | 113193028 A | * | 7/2021 | ........... H10K 59/124 |
| CN | 113241422 A | | 8/2021 | |
| KR | 20210008262 A | * | 1/2021 | ....... H01L 21/67733 |

* cited by examiner

DISPLAY SUBSTRATE AND DISPLAY APPARATUS

CROSS-REFERENCE TO RELATED APPLICATION

The present application is a U.S. National Phase Entry of International Application No. PCT/CN2021/128196 having an international filing date of Nov. 2, 2021, the content of which is incorporated into this application by reference.

TECHNICAL FIELD

The present disclosure relates to, but is not limited to, the field of display technology, in particular to a display substrate and a display apparatus.

BACKGROUND

As an active light-emitting display device, an Organic light-emitting Diode (OLED) has advantages of self-illumination, wide viewing angle, high contrast ratio, low power consumption, extremely quick response speed, etc. With continuous development of display technologies, a display apparatus using an OLED as a light emitting device and using a Thin Film Transistor (TFT) for signal control has become a mainstream product in the field of display at present.

SUMMARY

The following is a summary of subject matters described herein in detail. The summary is not intended to limit the protection scope of claims.

In a first aspect, an embodiment of the present disclosure provides a display substrate, including a base substrate and a circuit structure layer disposed on the base substrate, the circuit structure layer includes a flat region and a bendable region provided on at least one side of the flat region, the bendable region includes at least one stretch region, the stretch region includes a first pixel circuit region and a first power supply trace region, the first power supply trace region is located at one side of the first pixel circuit region away from the flat region, a first stretch hole is provided in the first power supply trace region, and a second stretch hole is provided in the first pixel circuit region.

In an exemplary implementation, the first power supply trace region includes a first power supply trace, the first power supply trace extends along a direction parallel to an edge of the stretch region.

In an exemplary implementation, the first power supply trace includes a first conductive layer, a connection conductive layer, and a second conductive layer which are stacked sequentially along a direction of thickness of the base substrate, and the first conductive layer and the second conductive layer are bridged by the connection conductive layer.

In an exemplary implementation, a first insulating layer is provided between the first conductive layer and the connection conductive layer, the first insulating layer is provided with a first via, the connection conductive layer is connected with the first conductive layer through the first via, a second insulating layer is provided between the second conductive layer and the connection conductive layer, the second insulating layer is provided with a second via, and the connection conductive layer is connected with the first conductive layer through the second via.

In an exemplary implementation, the first stretch hole includes a first directional stretch hole and a second directional stretch hole, the first directional stretch hole is a strip-shaped hole extending along a first direction, the second directional stretch hole is a strip-shaped hole extending along a second direction, a vertical projection of the first directional stretch hole on the base substrate does not overlap with a vertical projection of the second directional stretch hole on the base substrate, a number of first directional stretch holes is a plurality, the plurality of the first directional stretch holes are provided at intervals along the first direction to form a first directional stretch hole row, the second directional stretch holes are provided between adjacent first directional stretch holes in one first directional stretch hole row; and/or, a number of second directional stretch holes is a plurality, the plurality of the second directional stretch holes are provided at intervals along the second direction to form a second directional stretch hole row, the first directional stretch holes are provided between adjacent second directional stretch holes in one second directional stretch hole row, and the first direction and the second direction are intersected.

In an exemplary implementation, the first stretch hole includes a first directional stretch hole and a second directional stretch hole, the first directional stretch hole is an I-shaped hole extending along a first direction, the second directional stretch hole is an I-shaped hole extending along a second direction, a vertical projection of the first directional stretch hole on the base substrate does not overlap with a vertical projection of the second directional stretch hole on the base substrate, a number of first directional stretch holes is a plurality, the plurality of the first directional stretch holes are provided at intervals along the first direction to form a first directional stretch hole row, the second directional stretch holes are provided between adjacent first directional stretch holes in one first directional stretch hole row; and/or, a number of second directional stretch holes is a plurality, the plurality of the second directional stretch holes are provided at intervals along the second direction to form a second directional stretch hole row, the first directional stretch holes are provided between adjacent second directional stretch holes in one second directional stretch hole row, and the first direction and the second direction are intersected.

In an exemplary implementation, the first directional stretch hole and the second directional stretch hole each includes two first side portions disposed opposite to each other and a second side portion connecting the two first side portions, and the two first side portions and the second side portion form the I-shaped hole, in one first directional stretch hole row, a distance between edges of the first side portions of adjacent first directional stretch holes is greater than a length of the first side portion of the second directional stretch hole; and/or, in one second directional stretch hole row, a distance between edges of the first side portions of adjacent second directional stretch holes is greater than a length of the first side portion of the first directional stretch hole.

In an exemplary implementation, the first directional stretch hole and the second directional stretch hole each includes two first side portions disposed opposite to each other and a second side portion connecting the two first side portions, and the two first side portions and the second side portion form the I-shaped hole, in one first directional stretch hole row, a distance between edges of the first side portions of the adjacent first directional stretch holes is less than or equal to a length of the first side portion of the second directional stretch hole; and/or, in one second directional stretch hole row, a distance between edges of the first side portions of adjacent second directional stretch holes is less than or equal to a length of the first side portion of the first directional stretch hole.

In an exemplary implementation, the stretch region is located in a corner region of the bendable region.

In an exemplary implementation, the first power supply trace region is an edge region on a side of the stretch region away from the flat region.

In an exemplary implementation, the flat region includes a gate driver on array and a second pixel circuit region located at least one side of the gate driver on array, and a third stretch hole is provided in the gate driver on array.

In an exemplary implementation, a shape of the third stretch hole is the same as or different from a shape of the first stretch hole, and a stretch ratio of the third stretch hole is different from a stretch ratio of the first stretch hole.

In an exemplary implementation, the gate driver on array includes at least one sub-gate driver on array, the sub-gate driver on array includes a plurality of gate drive units in cascade, the plurality of the gate drive units are sequentially provided along the first direction, the gate drive unit includes a plurality of gate drive island regions in cascade, the third stretch hole located between adjacent gate drive island regions, and a trace region connecting the adjacent gate drive island regions to each other, the plurality of the gate drive island regions are sequentially provided along the second direction, the first direction and the second direction are intersected.

In an exemplary implementation, the sub-gate driver on array further includes an output signal line, a first end of the output signal line is connected to the gate drive unit, and a second end of the output signal line extends to the second pixel circuit region.

In an exemplary implementation, the gate driver on array and the flat region have the same central axis in the first direction.

In an exemplary implementation, the flat region further includes a plurality of second power supply traces and a plurality of second power supply fan-out lines, orthographic projections of the plurality of the second power supply traces on the base substrate at least partially overlap with orthographic projections of the plurality of the second power supply fan-out lines on the base substrate; the plurality of the second power supply fan-out lines are correspondingly connected to a portion of the plurality of the second power supply traces.

In an exemplary implementation, the circuit structure layer further includes a bonding region provided on one side of the flat region, the bonding region at least includes a lead region, the lead region includes a plurality of lead lines, a first end of the at least one of the second power supply fan-out lines is connected with the lead line, and a second end of the at least one of the second power supply fan-out lines is connected with the second power supply fan-out line.

In an exemplary implementation, the plurality of the second power supply traces extend along a first direction and are provided at intervals along a second direction, spacings between adjacent second power supply traces gradually decrease with nearing to a central axis, in the first direction, of the flat region; the first direction and the second direction are intersected.

In an exemplary implementation, a shape of the second stretch hole is the same as or different from a shape of the first stretch hole, and a stretch ratio of the second stretch hole is different from a stretch ratio of the first stretch hole.

In a second aspect, an embodiment of the present disclosure further provides a display apparatus including the display substrate described above.

Other aspects may be comprehended upon drawings and detailed description are read and understood.

BRIEF DESCRIPTION OF DRAWINGS

Accompanying drawings are used for providing further understanding of technical solutions of the present disclosure, constitute a part of the specification, and together with the embodiments of the present disclosure, are used for explaining the technical solutions of the present disclosure but not to constitute limitations on the technical solutions of the present disclosure. Shapes and sizes of various components in the drawings do not reflect actual scales, and are only intended to schematically illustrate contents of the present disclosure.

DETAILED DESCRIPTION

Figure 1:
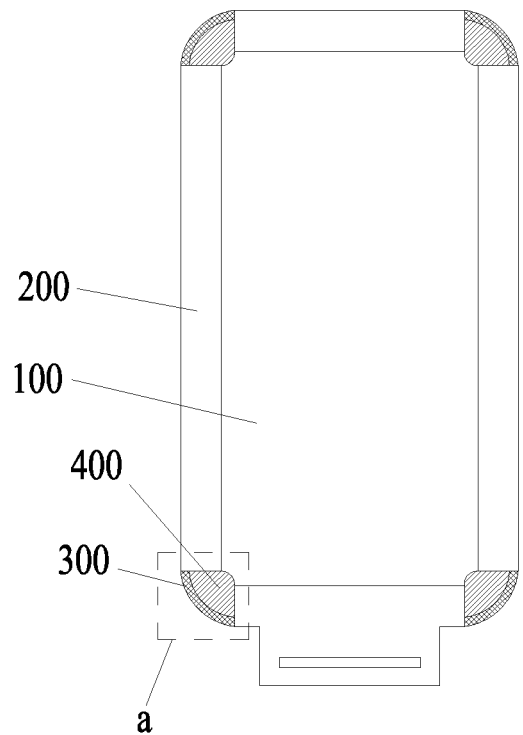
FIG. 1 is a schematic diagram of a structure of a circuit structure layer in a display substrate.

To make objectives, technical solutions, and advantages of the present disclosure clearer, the embodiments of the present disclosure will be described in detail with reference to the accompanying drawings. It is to be noted that implementations may be implemented in multiple different forms. Those of ordinary skills in the art may easily understand such a fact that implementations and contents may be transformed into various forms without departing from the purpose and scope of the present disclosure. Therefore, the present disclosure should not be explained as being limited to contents described in following implementations only. The embodiments in the present disclosure and features in the embodiments may be combined randomly with each other without conflict. In order to make following description of the embodiments of the present disclosure clear and concise, detailed descriptions about part of known functions and known components are omitted in the present disclosure. The drawings of the embodiments of the present disclosure only involve structures involved in the embodiments of the present disclosure, and other structures may refer to usual designs.

In the drawings, sizes of various constituent elements, thicknesses of various layers, or regions are exaggerated sometimes for clarity. Therefore, one implementation of the present disclosure is not necessarily limited to the dimension, and shapes and sizes of various components in the drawings do not reflect actual scales. In addition, the drawings schematically illustrate ideal examples, and one implementation of the present disclosure is not limited to the shapes, numerical values, or the like shown in the drawings.

Ordinal numerals such as "first", "second", and "third" in the specification are set to avoid confusion of constituent elements, but not to make a limit in quantity.

In the specification, for convenience, wordings indicating directional or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that the mentioned apparatus or element must have a particular orientation and be constructed and operated in the particular orientation. Therefore, they cannot be understood as limitations on the present disclosure. The positional relationships between the constituent elements may be changed as appropriate according to directions for describing the constituent elements. Therefore, appropriate replacements can be made according to situations without being limited to the wordings described in the specification.

In the specification, unless otherwise specified and defined explicitly, terms "mount", "mutually connect", and "connect" should be understood in a broad sense. For example, a connection may be a fixed connection, or a detachable connection, or an integrated connection. It may be a mechanical connection or an electrical connection. It may be a direct connection, or an indirect connection through middleware, or internal communication between two components. Those of ordinary skill in the art may understand specific meanings of these terms in the present disclosure according to specific situations.

In the specification, a transistor refers to a component which at least includes three terminals, i.e., a gate electrode, a drain electrode and a source electrode. The transistor has a channel region between the drain electrode (drain electrode terminal, drain region, or drain) and the source electrode (source electrode terminal, source region, or source), and a current may flow through the drain electrode, the channel region, and the source electrode. It is to be noted that, in the specification, the channel region refers to a region through which the current mainly flows.

In the specification, a first electrode may be the drain electrode, and a second electrode may be the source electrode. Or, the first electrode may be the source electrode, and the second electrode may be the drain electrode. In a case where transistors with opposite polarities are used, a current direction changes during operation of a circuit, or the like, functions of the "source electrode" and the "drain electrode" are sometimes interchangeable. Therefore, the "source electrode" and the "drain electrode" are interchanged in the specification.

In the specification, "electrical connection" includes a case where constituent elements are connected together through an element with a certain electrical effect. The "element with the certain electrical effect" is not particularly limited as long as electrical signals may be sent and received between the connected constituent elements. Examples of the "element with the certain electrical effect" not only include electrodes and wirings, but also include switch elements (such as transistors), resistors, inductors, capacitors, other elements with various functions, etc.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

In the specification, a "film" and a "layer" are interchangeable. For example, a "conductive layer" may be replaced with a "conductive film" sometimes. Similarly, an "insulating film" may be replaced with an "insulating layer" sometimes.

In the present disclosure, "about" refers to that a boundary is defined not so strictly and numerical values within process and measurement error ranges are allowed.

Figure 2:
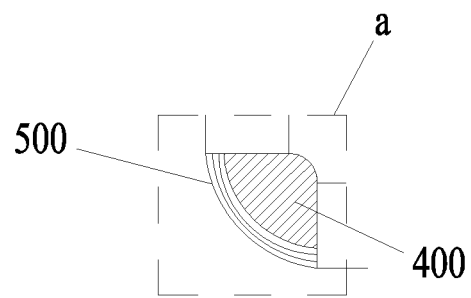
FIG. 2 is an enlarged view of a circuit structure layer in a display substrate.

FIG. 1 is a schematic diagram of a structure of a circuit structure layer in a display substrate; and FIG. 2 is an enlarged view of a circuit structure layer in a display substrate. As an example, FIG. 2 shows an enlarged view at a in FIG. 1. The display substrate includes a base substrate and the circuit structure layer disposed on the base substrate. As shown in FIG. 1 and FIG. 2, the circuit structure layer includes a flat region 100, and a bendable region 200 located at least one side of the flat region 100. The bendable region 200 may be in a crimped state formed by bending. The bendable region 200 includes at least one stretch region 300. Exemplarily, the flat region 100 is a rectangular structure, one side of the flat region 100 is provided with a bonding region, and the bendable region 200 is provided around other sides of the flat region 100. The stretch region 300 is located in a corner region of the bendable region 200.

As shown in FIG. 2, the stretch region 300 includes a first pixel circuit region 400 and a trace circuit region 500. The trace circuit region 500 is located on a side of the first pixel circuit region 400 away from the flat region 100. The first pixel circuit region 400 includes a pixel drive circuit and at least one stretch hole. The pixel drive circuit is used to drive a light emitting unit to emit light. The stretch hole may be used to provide a deformation space during stretching, to increase flexibility of the stretch region 300 and to achieve stretchability. The trace circuit region 500 includes a gate driver on array (GOA), a first power supply trace region (e.g. a VSS trace region) and a second power supply trace region (e.g. a VDD trace region). The first power supply trace region, the second power supply trace region and the GOA are sequentially provided along a direction close to the flat region 100. Since stretch holes cannot be provided in the gate driver on array, the first power supply trace region and the second power supply trace region, the trace circuit region 500 is a planar structure, that is, the trace circuit region 500 is not provided with stretch holes, thereby when the stretch region 300 is stretched, the risks of wrinkling and broken wires at the trace circuit region 500 easily occur, resulting in overall failure of the display substrate.

An embodiment of the present application provides a display substrate, including a base substrate and a circuit structure layer disposed on the base substrate, the circuit structure layer includes a flat region and a bendable region provided on at least one side of the flat region, the bendable region includes at least one stretch region, the stretch region includes a first pixel circuit region and a first power supply trace region, the first power supply trace region is located at one side of the first pixel circuit region away from the flat region, and a first stretch hole is provided in the first power supply trace region.

According to the display substrate of the embodiment of the present application, the first stretch hole is provided in the first power supply trace region in the stretch region, and the second stretch hole is provided in the first pixel circuit region in the stretch region, so that the whole stretch region has an opening structure, thus avoiding a problem of occurring the risks of wrinkles and broken wires when the stretch region is stretched.

Solutions of the embodiments will be described below through some examples.

Figure 3:
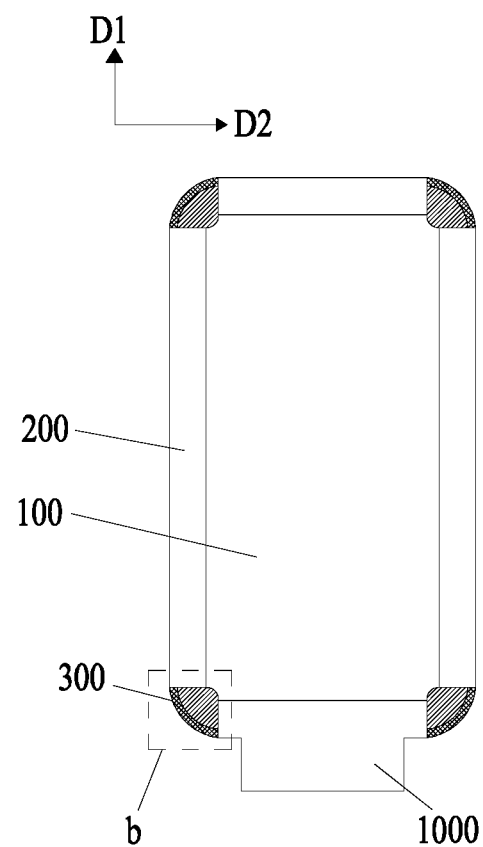
FIG. 3 is a schematic diagram of a structure of a circuit structure layer in a display substrate according to an embodiment of the present application.

FIG. 3 is a schematic diagram of a structure of a circuit structure layer in a display substrate according to an embodiment of the present application. The display substrate according to an embodiment of the present application includes a base substrate, a circuit structure layer disposed on the base substrate. As shown in FIG. 3 the circuit structure layer includes a flat region 100, a bonding region 1000 located on an opposite side of a first direction D1 of the flat region 100, and a bendable region 200 located on other sides of the flat region 100. The bendable region 200 includes at least one stretch region 300. Exemplarily, the flat region 100 is rectangular, and the bendable region 200 surrounds periphery of the other sides of the flat region 100 except the side where the bonding region 1000 is located. The bendable region 200 includes four stretch regions 300 that are respectively located in four corner regions of the bendable region 200.

Figure 4:
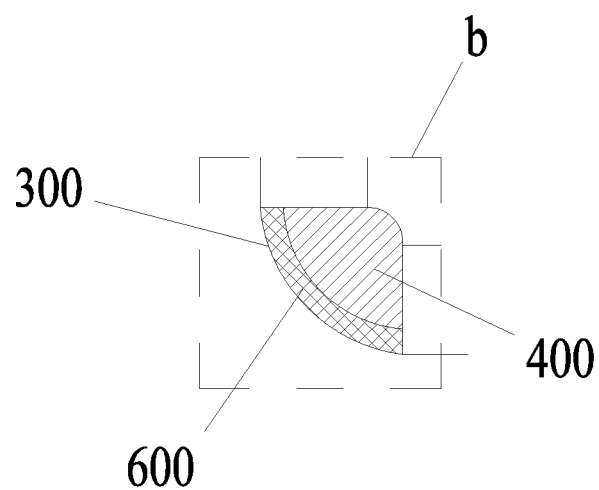
FIG. 4 is an enlarged view of a circuit structure layer in a display substrate according to an embodiment of the present application.

FIG. 4 is an enlarged view of a circuit structure layer in a display substrate according to an embodiment of the present application. In an exemplary implementation, as an example, FIG. 4 shows an enlarged view at b in FIG. 3. As shown in FIG. 3 and FIG. 4, the stretch region 300 includes a first pixel circuit region 400, and a first power supply trace region 600 that is located on a side of the first pixel circuit region 400 away from the flat region 100. The first power supply trace region 600 is an edge region on a side of the stretch region 300 away from the flat region 100. The first pixel circuit region 400 may include a plurality of transistors and storage capacitors. The first pixel circuit region 400 may have a 3T1C, 4T1C, 5T1C, 5T2C, 6T1C, or 7T1C structure, which will not be repeated in the embodiments of the present disclosure. The first power supply trace region 600 includes a plurality of first power supply traces configured to output a first level signal to the first pixel circuit region 400 and a second pixel circuit region in the flat region 100. The first level signal may be a low level signal (VSS). Herein, the first power supply trace region 600 is provided with a first stretch hole, and the first pixel circuit region is provided with a second stretch hole.

In the circuit structure layer of the display substrate of the embodiment of the present disclosure, no other circuit region is provided in the stretch region 300 except for the first pixel circuit region 400 and the first power supply trace region 600. The display substrate according to the embodiment of the present disclosure is provided with the first stretch hole that is in the first power supply trace region 600 in the stretch region 300, and the second stretch hole that is in the first pixel circuit region 400 in the stretch region 300, so that the entire stretch region 300 has an opening structure, i.e., the first stretch hole and the second stretch hole, avoiding a problem of occurring the risks of wrinkles and broken wires when the stretch region 300 is stretched.

In some exemplary implementations, the display substrate in the present embodiment may be an Organic Light Emitting Diode (OLED) display substrate or a Quantum-dot Light Emitting Diode (QLED) display substrate. However, this embodiment is not limited thereto.

Figure 5:
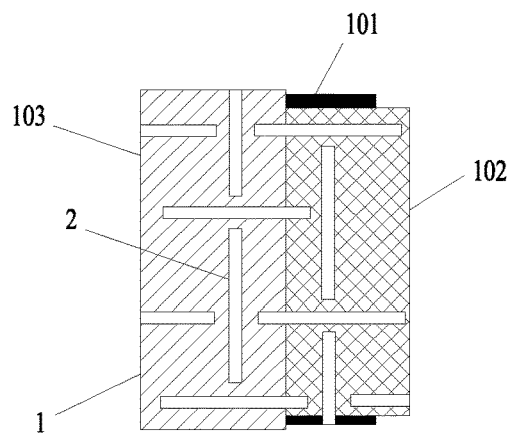
FIG. 5 is an enlarged view of a first power supply trace in a display substrate according to an embodiment of the present application.

FIG. 5 is an enlarged view of a first power supply trace in a display substrate according to an embodiment of the present application. In an exemplary implementation, as shown in FIG. 5, a first power supply trace 1 may extend in a direction parallel to an edge of the stretch region 300. The first power supply trace 1 includes a first conductive layer 101, a connection conductive layer 102, and a second conductive layer 103, which are stacked sequentially along a direction of thickness of the base substrate. The first conductive layer 101 and the second conductive layer 103 are bridged by the connection conductive layer 102. Exemplarily, a first insulating layer is provided between the first conductive layer 101 and the connection conductive layer 102, and a second insulating layer is provided between the second conductive layer 103 and the connection conductive layer 102. A vertical projection of at least portion of the connection conductive layer 102 on the base substrate overlaps with a vertical projection of the first conductive layer 101 on the base substrate, and a vertical projection of at least portion of the connection conductive layer 102 on the base substrate overlaps with a vertical projection of the second conductive layer 103 on the base substrate. The first insulating layer is provided with a first via, the second insulating layer is provided with a second via, the connection conductive layer 102 is connected with the first conductive layer 101 through the first via, and the connection conductive layer 102 is connected with the second conductive layer 103 through the second via.

In an exemplary implementation, a plurality of the first stretch holes 2 are provided in the first power supply trace region 600, and at least a portion of the first stretch holes 2 are located in the first power supply trace 1. At least a portion of the first stretch holes 2 is located in at least one of the first conductive layer 101, the connection conductive layer 102, and the second conductive layer 103. For example, the first stretch holes 2 are only provided on the first conductive layer; and/or, the first stretch holes 2 are only provided on the connection conductive layer; and/or, the first stretch holes 2 are only provided on the second conductive layer; and/or, a portion of the first stretch holes 2 are provided on the first conductive layer, a portion of the first stretch holes 2 are provided on the connection conductive layer, and a portion of the first stretch holes 2 are provided on the second conductive layer; and/or, a portion of the first stretch holes 2 are provided on the first conductive layer, and the other portion of the first stretch holes 2 are provided on the connection conductive layer; and/or, a portion of the first stretch holes 2 are provided on the second conductive layer, and the other portion of the first stretch holes 2 are provided on the connection conductive layer.

Figure 6:
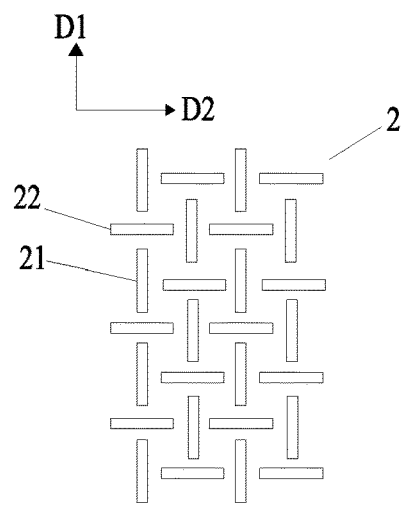
FIG. 6 is a first schematic diagram of a structure of a first stretch hole in a display substrate according to an embodiment of the present application.

FIG. 6 is a first schematic diagram of a structure of a first stretch hole in a display substrate according to an embodiment of the present application. In an exemplary implementation, as shown in FIG. 6, the first stretch hole 2 includes a first directional stretch hole 21 and a second directional stretch hole 22. The first directional stretch hole 21 is a strip-shaped hole extending along a first direction D1, and the second directional stretch hole 22 is a strip-shaped hole extending along a second direction D2. A vertical projection of the first directional stretch hole 21 on the base substrate does not overlap with a vertical projection of the second directional stretch hole 22 on the base substrate. The number of the first directional stretch holes 21 is a plural, the plural of first directional stretch holes 21 are provided at intervals along the first direction D1 to form a first directional stretch hole row, and the second directional stretch holes 22 are provided between adjacent the first directional stretch holes 21 in one first directional stretch hole row; and/or, the number of the second directional stretch holes 22 is a plural, the plural of the second directional stretch holes 22 are provided at intervals along the second direction D2 to form a second directional stretch hole row, and the first directional stretch holes 21 are provided between adjacent the second directional stretch holes 22 in one second directional stretch hole row. Herein, the first direction D1 and the second direction D2 are intersected. For example, the first direction D1 is provided perpendicularly to the second direction D2.

Figure 7:
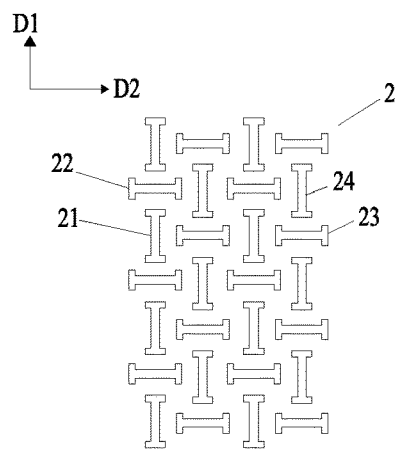
FIG. 7 is a second schematic diagram of a structure of a first stretch hole in a display substrate according to an embodiment of the present application.

FIG. 7 is a second schematic diagram of a structure of a first stretch hole in a display substrate according to an embodiment of the present application. In an exemplary implementation, as shown in FIG. 7, the first stretch hole 2 includes a first directional stretch hole 21 and a second directional stretch hole 22. The first directional stretch hole 21 is an I-shaped hole extending along the first direction D1, the second directional stretch hole 22 is an I-shaped hole extending along the second direction D2, a vertical projection of the first directional stretch hole 21 on the base substrate does not overlap with a vertical projection of the second directional stretch hole 22 on the base substrate. The number of the first directional stretch holes 21 is a plural, the plural of the first directional stretch holes 21 are provided at intervals along the first direction D1 to form a first directional stretch hole row, and the second directional stretch holes 22 are provided between adjacent the first directional stretch holes 21 in one first directional stretch hole row; and/or, the number of the second directional stretch holes 22 is a plural, the plural of the second directional stretch holes 22 are provided at intervals along the second direction D2 to form a second directional stretch hole row, and the first directional stretch holes 21 are provided between adjacent the second directional stretch holes 22 in one second directional stretch hole row. The first direction D1 and the second direction D2 are intersected. For example, the first direction D1 is provided perpendicularly to the second direction D2.

In an exemplary implementation, as shown in FIG. 7, the first directional stretch hole 21 and the second directional stretch hole 22 each includes two first side portions 23 disposed opposite to each other and a second side portion 24 connecting the two first side portions 23, and the two first side portions 23 and the second side portion 21 form the I-shaped hole. In the first directional stretch hole row, a distance between edges of the first side portions 23 of adjacent first directional stretch holes 21 is greater than a length of the first side portion 23 of the second directional stretch hole 22; and/or, in the second directional stretch hole row, a distance between edges of the first side portions 23 of adjacent second directional stretch holes 22 is greater than a length of the first side portion 23 of the first directional stretch hole 21.

Figure 8:
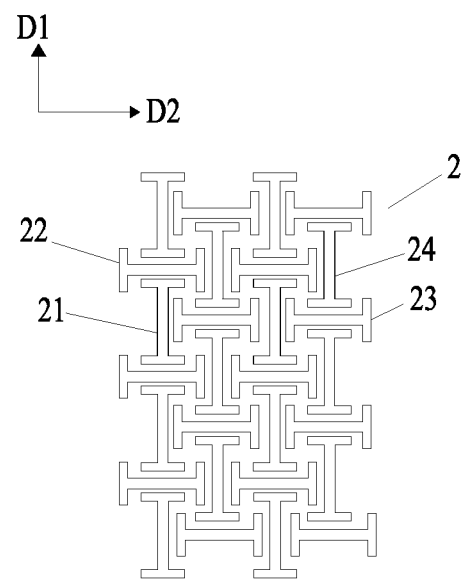
FIG. 8 is a third schematic diagram of a structure of a first stretch hole in a display substrate according to an embodiment of the present application.

FIG. 8 is a third schematic diagram of a structure of a first stretch hole in a display substrate according to an embodiment of the present application. In an exemplary implementation, as shown in FIG. 8, the first directional stretch hole 21 and the second directional stretch hole 22 each includes two first side portions 23 disposed opposite to each other and a second side portion 24 connecting the two first side portions 23, and the two first side portions 23 and the second side portion 21 form the I-shaped hole. In a first directional stretch hole row, a distance between edges of the first side portions 23 of adjacent first directional stretch holes 21 is less than or equal to a length of the first side portion 23 of the second directional stretch hole 22; and/or, in a second directional stretch hole row, a distance between edges of the first side portions 23 of adjacent second directional stretch holes 22 is less than or equal to a length of the first side portion 23 of the first directional stretch hole 21.

In an exemplary implementation, the shape and distribution of the second stretch hole may be the same as or different from the shape and distribution of the first stretch hole, and a stretch ratio of the second stretch hole is different from a stretch ratio of the first stretch hole, which will not be repeated in the embodiments of the present application.

In an exemplary implementation, the flat region of this embodiment is also provided with a plurality of data lines. The first conductive layer may be provided in the same layer as the data lines, and is prepared by using the same material and the same preparation process. The display substrate of this embodiment also includes a light emitting structure layer provided on the circuit structure layer, and the light emitting structure layer includes an anode, a light emitting layer, a cathode and the like. The connection conductive layer 102 may be provided in the same layer as the anode, and is prepared by using the same material and the same preparation process. The second conductive layer 103 may be provided in the same layer as the cathode, and is prepared by using the same material and the same preparation process.

Figure 9:
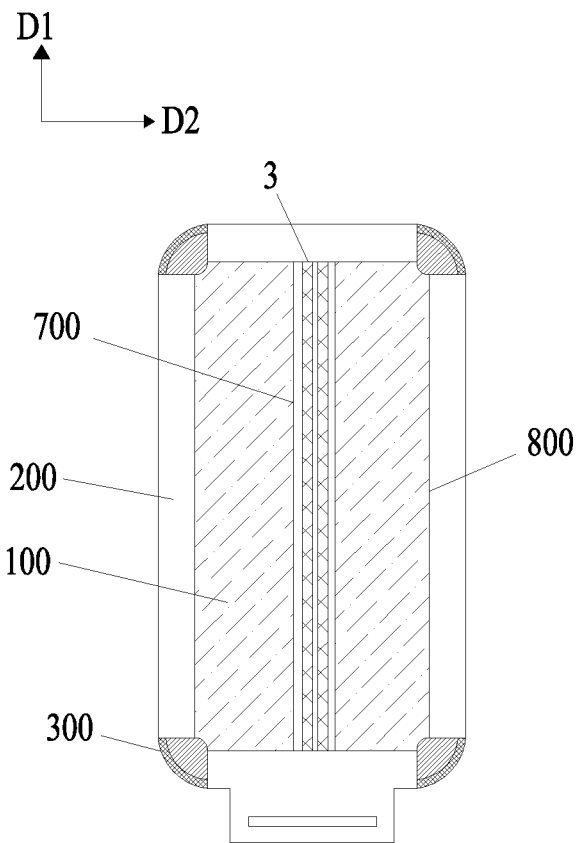
FIG. 9 is a schematic diagram of a structure of a flat region of a circuit structure layer in a display substrate according to an embodiment of the present application.

FIG. 9 is a schematic diagram of a structure of a flat region of a circuit structure layer in a display substrate according to an embodiment of the present application. In an exemplary implementation, as shown in FIG. 9, the flat region 100 includes a gate driver on array (GOA for short) 700, and a second pixel circuit region 800 located at least one side of the GOA 700, and the second pixel circuit region 800 may include a plurality of transistors and storage capacitors. The second pixel circuit region 800 may have a 3T1C, 4T1C, 5T1C, 5T2C, 6T1C, or 7T1C structure, which will not repeated in the embodiments of the present disclosure. A third stretch hole is provided in the GOA 700. GOA 700 may be used to transmit a scan signal and a light emitting signal to the first pixel circuit region of the stretch region 300 and the second pixel circuit region 800 of the flat region 100.

In the embodiment of the present application, the GOA 700 is removed from the bendable region 200 and provided in the flat region 100, so as to reduce an area of the trace circuit region in the stretch region 300, and reduce the risks of wrinkles and broken wires in the trace circuit region when the stretch region 300 is stretched. In the embodiment of the present application, the third stretch hole is provided in the GOA 700, so that the GOA 700 is stretchable, which reduces affection of the GOA 700 on the flat region 100.

In an exemplary implementation, as shown in FIG. 9, the GOA 700 includes at least one sub-GOA 3. For example, the GOA 700 includes two sub-GOAs, i.e., a first sub-GOA and a second sub-GOA both extending along the first direction D1, the first sub-GOA is configured to transmit scan signals to the first pixel circuit region of the stretch region 300 and the second pixel circuit region 800 of the flat region 100; and the second sub-GOA is configured to transmit light emitting signals to the first pixel circuit region of the stretch region 300 and the second pixel circuit region 800 of the flat region 100.

Figure 10:
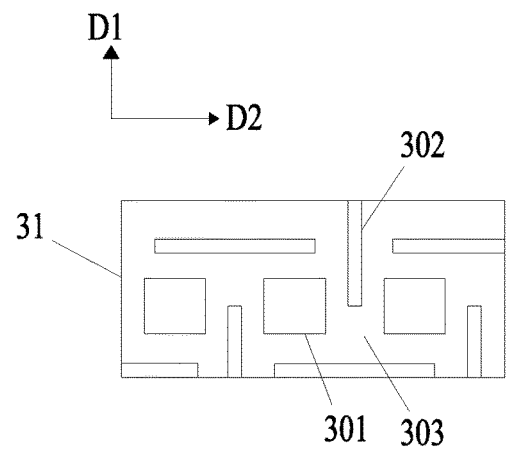
FIG. 10 is an enlarged view of a gate drive unit in a display substrate according to an embodiment of the present application.

FIG. 10 is an enlarged view of a gate drive unit in a display substrate according to an embodiment of the present application. In an exemplary implementation, a sub-GOA includes a plurality of the gate drive units in cascade, and the plurality of the gate drive units are sequentially provided along the first direction D1. As shown in FIG. 10, one gate drive unit 31 includes a plurality of gate drive island regions 301 in cascade, a third stretch hole 302 located between adjacent gate drive island regions 301, and a trace region 303 connecting the adjacent gate drive island regions 301 to each other, and the plurality of gate drive island regions 301 are provided in sequence along the second direction. The gate drive island regions 301 each includes a sub-gate drive circuit, and the sub-gate drive circuits in all gate drive island regions 301 in one gate drive unit 31 constitute one gate drive circuit. The trace region 303 includes a plurality of connection leads connecting sub-gate drive circuits in adjacent gate drive island regions 301 to each other. The third stretch hole 302 is used to provide a deformation space during stretching. For example, the gate drive unit 31 may be an 8T2C (i.e., eight transistors and two capacitors) structure, or a 12T4C (i.e., twelve transistors and four capacitors) structure, etc. Taking the gate drive unit 31 being an 8T2C structure as an example, the gate drive unit 31 includes three gate drive island regions 301 in cascade, and the 8T2C circuit is split into three sub-gate drive circuits, three sub-gate drive circuits are respectively provided in the three gate drive island regions 301, that is, the three sub-gate drive circuits in the three gate drive island regions 301 form the 8T2C circuit. Herein, the first direction D1 and the second direction D2 are intersected. In an example, the first direction D1 is provided perpendicularly to the second direction D2.

In an exemplary implementation, the shape and distribution of the third stretch hole may be the same as or different from the shape and distribution of the first stretch hole, and a stretch ratio of the third stretch hole is different from the stretch ratio of the first stretch hole, which will not be repeated in the embodiments of the present application.

In an exemplary implementation, the stretch ratios of the first stretch hole, the second stretch hole and the third stretch hole may be adjusted according to the needs, and may be the same or different.

In an exemplary implementation, the gate drive unit may include at least one output signal line, a first end of which is connected to the gate drive unit, and a second end of which may extend along a second direction D2 to a second pixel circuit region in the flat region. After extending to the second pixel circuit region, the output signal line may be connected with the scan signal line or the light emitting signal line in the second pixel circuit region, and the gate drive unit may output a scan signal or a light emitting signal to the second pixel circuit region.

In an exemplary implementation, the GOA and the flat region have the same central axis in the first direction, i.e., the GOA is located in the middle region of the flat region in the second direction, thereby facilitating the tracing of the GOA.

Figure 11:
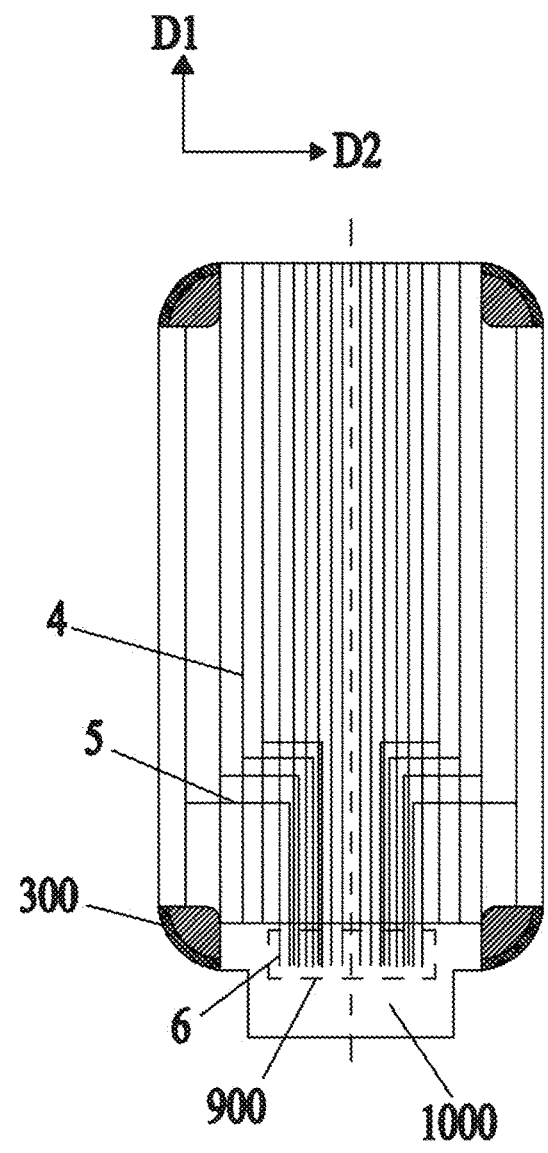
FIG. 11 is a distribution diagram of second power supply traces and second power supply fan-out lines of a circuit structure layer in a display substrate according to an embodiment of the present application.

FIG. 11 is a distribution diagram of second power supply traces and second power supply fan-out lines of a circuit structure layer in a display substrate according to an embodiment of the present application. In an exemplary implementation, as shown in FIG. 11, the flat region 100 further includes a plurality of second power supply traces 4 and a plurality of second power supply fan-out lines 5. Orthographic projections of the plurality of the second power supply traces 4 on the base substrate overlap at least partially with orthographic projections of the plurality of the second power supply fan-out lines 5 on the base substrate. The bonding region 1000 includes a lead region 900 which may include a plurality of lead lines 6. The plurality of the second power supply traces 4 are configured to output a second level signal to the first pixel circuit region 400 and the second pixel circuit region in the flat region 100. Herein, the second level signal may be a high level signal (VDD). The plurality of the second power supply fan-out lines 5 are correspondingly connected to a portion of the second power supply traces 4, and are configured to connect correspondingly a portion of the second power supply traces 4 to a plurality of the lead lines 6 in the bonding region 1000.

In an exemplary implementation, as shown in FIG. 11, the plurality of second power supply traces 4 extend along the first direction D1 and are provided at intervals along the second direction D2. Spacings between adjacent second power supply traces 4 gradually decrease with nearing to a central axis, in the first direction, of the flat region 100. That is, the density of the plurality of the second power supply traces 4 gradually increases with nearing to a central axis, in the first direction, of the flat region 100. Herein, the first direction D1 and the second direction D2 are intersected. In an example, the first direction D1 is provided perpendicularly to the second direction D2.

The pixel circuits on the circuit structure layer form a plurality of pixel circuit rows and a plurality of pixel circuit columns. A plurality of second power supply traces 4 extend along a first direction D1, and are provided sequentially at predefined intervals along a second direction D2, and each second power supply trace is connected to all pixel circuits of one pixel circuit column in the circuit structure layer.

In an exemplary implementation, a first end of each second power supply fan-out line 5 is correspondingly connected to a portion of the lead lines 6 of the lead region 900, and a second end of each second power supply fan-out line 5 is correspondingly connected to a portion of the second power supply traces 4. A portion of the lead lines 6 in the lead region 900 are connected to the second power supply fan-out lines 5, and another portion of the lead lines 6 are correspondingly connected to another portion of the second power supply traces 4.

In an exemplary implementation, there is no overlapping region between an orthographic projection of any one of the lead lines 6 on the base substrate and orthographic projections of the other lead lines 6 on the base substrate, and there is no overlapping region between an orthographic projection of any one of the second power supply fan-out lines 5 on the base substrate and orthographic projections of the other second power supply fan-out lines 5 on the base substrate.

An embodiment of the present disclosure further provides a display apparatus including the display substrate of the above embodiments. The display apparatus may be any product or component with a display function, such as a mobile phone, a tablet computer, a television, a display, a notebook computer, a digital photo frame, a navigator, an advertising panel, a watch phone, an E-book portable multimedia player, or display screens of various products of Internet of Things. In an exemplary implementation, the display apparatus may be a wearable display apparatus which may be worn on a human body in some manners, such as a smart watch and a smart bracelet.

The drawings of the present disclosure only involve structures involved in the present disclosure, and other structures may refer to conventional designs. The embodiments in the present disclosure, i.e., features in the embodiments, may be combined with each other to obtain new embodiments if there is no conflict.

Those of ordinary skills in the art should understand that modifications or equivalent replacements may be made to the technical solutions of the present disclosure without departing from the spirit and scope of the technical solutions of the present disclosure, and shall all fall within the scope of the claims of the present disclosure.

The invention claimed is:

1. A display substrate, comprising a base substrate and a circuit structure layer disposed on said base substrate, wherein said circuit structure layer comprises a flat region and a bendable region provided on at least one side of said flat region, said bendable region comprises at least one stretch region, said stretch region comprises a first pixel circuit region and a first power supply trace region, said first power supply trace region is located at one side of said first pixel circuit region away from said flat region, a first stretch hole is provided in said first power supply trace region, and a second stretch hole is provided in said first pixel circuit region.

2. The display substrate according to claim 1, wherein said first power supply trace region comprises a first power supply trace, said first power supply trace extends along a direction parallel to an edge of said stretch region.

3. The display substrate according to claim 2, wherein said first power supply trace comprises a first conductive layer, a connection conductive layer, and a second conductive layer, which are stacked sequentially along a direction of thickness of said base substrate, and said first conductive layer and said second conductive layer are bridged by said connection conductive layer.

4. The display substrate according to claim 3, wherein a first insulating layer is provided between said first conductive layer and said connection conductive layer, said first insulating layer is provided with a first via, said connection conductive layer is connected with said first conductive layer through said first via, a second insulating layer is provided between said second conductive layer and said connection conductive layer, said second insulating layer is provided with a second via, and said connection conductive layer is connected with said first conductive layer through said second via.

5. The display substrate according to claim 1, wherein said first stretch hole comprises a first directional stretch hole and a second directional stretch hole, said first directional stretch hole is a strip-shaped hole extending along a first direction, said second directional stretch hole is a strip-shaped hole extending along a second direction, a vertical projection of said first directional stretch hole on said base substrate does not overlap with a vertical projection of said second directional stretch hole on said base substrate, a number of first directional stretch holes is a plurality, the plurality of first directional stretch holes are provided at intervals along said first direction to form a first directional stretch hole row, second directional stretch holes are provided between adjacent first directional stretch holes in one first directional stretch hole row; and/or, a number of second directional stretch holes is a plurality, the plurality of second directional stretch holes are provided at intervals along said second direction to form a second directional stretch hole row, first directional stretch holes are provided between adjacent second directional stretch holes in one second directional stretch hole row, and said first direction and said second direction are intersected.

6. The display substrate according to claim 1, wherein said first stretch hole comprises a first directional stretch hole and a second directional stretch hole, said first directional stretch hole is an I-shaped hole extending along a first direction, said second directional stretch hole is an I-shaped hole extending along a second direction, a vertical projection of said first directional stretch hole on said base substrate does not overlap with a vertical projection of said second directional stretch hole on said base substrate, a number of first directional stretch holes is a plurality, the plurality of first directional stretch holes are provided at intervals along said first direction to form a first directional stretch hole row, second directional stretch holes are provided between adjacent first directional stretch holes in one first directional stretch hole row; and/or, a number of second directional stretch holes is a plurality, the plurality of second directional stretch holes are provided at intervals along said second direction to form a second directional stretch hole row, first directional stretch holes are provided between adjacent second directional stretch holes in one second directional stretch hole row, and said first direction and said second direction are intersected.

7. The display substrate according to claim 6, wherein said first directional stretch hole and said second directional stretch hole each comprises two first side portions disposed opposite to each other and a second side portion connecting said two first side portions, and said two first side portions and said second side portion form said I-shaped hole, in one first directional stretch hole row, a distance between edges of first side portions of adjacent first directional stretch holes is greater than a length of said first side portion of said second directional stretch hole; and/or, in one second directional stretch hole row, a distance between edges of first side portions of adjacent second directional stretch holes is greater than a length of said first side portion of said first directional stretch hole.

8. The display substrate according to claim 6, wherein said first directional stretch hole and said second directional stretch hole each comprises two first side portions disposed opposite to each other and a second side portion connecting said two first side portions, and said two first side portions and said second side portion form said I-shaped hole, in one first directional stretch hole row, a distance between edges of first side portions of adjacent first directional stretch holes is less than or equal to a length of said first side portion of said second directional stretch hole; and/or, in one second directional stretch hole row, a distance between edges of first side portions of adjacent second directional stretch holes is less than or equal to a length of said first side portion of said first directional stretch hole.

9. The display substrate according to claim 1, wherein said stretch region is located in a corner region of said bendable region.

10. The display substrate according to claim 1, wherein said first power supply trace region is an edge region on a side of said stretch region away from said flat region.

11. The display substrate according to claim 1, wherein said flat region comprises a gate driver on array, and a second pixel circuit region located at least one side of said gate driver on array, and a third stretch hole is provided in said gate driver on array.

12. The display substrate according to claim 11, wherein a shape of said third stretch hole is the same as or different from a shape of said first stretch hole, and a stretch ratio of said third stretch hole is different from a stretch ratio of said first stretch hole.

13. The display substrate according to claim 11, wherein said gate driver on array comprises at least one sub-gate driver on array, said sub-gate driver on array comprises a plurality of gate drive units in cascade, the plurality of the gate drive unit are sequentially provided along a first direction, the gate drive units each comprises a plurality of gate drive island regions in cascade, said third stretch holes located between adjacent gate drive island regions, and a trace region connecting adjacent gate drive island regions to each other, the plurality of the gate drive island regions are sequentially provided along a second direction, said first direction and said second direction are intersected.

14. The display substrate according to claim 13, wherein said sub-gate driver on array further comprises an output signal line, a first end of said output signal line is connected to said gate drive unit, and a second end of said output signal line extends to said second pixel circuit region.

15. The display substrate according to claim 13, wherein said gate driver on array and said flat region have a same central axis in said first direction.

16. The display substrate according to claim 1, wherein said flat region further comprises a plurality of second power supply traces and a plurality of second power supply fan-out lines, orthographic projections of said plurality of second power supply traces on said base substrate at least partially overlap with orthographic projections of said plurality of second power supply fan-out lines on said base substrate; said plurality of second power supply fan-out lines are correspondingly connected to a portion of said plurality of second power supply traces.

17. The display substrate according to claim 16, wherein said circuit structure layer further comprises a bonding region provided on one side of said flat region, said bonding region at least comprises a lead region, said lead region comprises a plurality of lead lines, a first end of at least one of said second power supply fan-out lines is connected with said lead line, and a second end of at least one of said second power supply fan-out lines is connected with said second power supply fan-out line.

18. The display substrate according to claim 16, wherein said plurality of second power supply traces extend along a first direction and are provided at intervals along a second direction, spacings between adjacent second power supply traces gradually decrease with nearing to a central axis, in said first direction, of said flat region; said first direction and said second direction are intersected.

19. The display substrate according to claim 1, wherein a shape of said second stretch hole is the same as or different from a shape of said first stretch hole, and a stretch ratio of said second stretch hole is different from a stretch ratio of said first stretch hole.

20. A display apparatus, comprising the display substrate according to claim 1.

* * * * *